(12) United States Patent
Takada

(10) Patent No.: US 7,777,477 B2
(45) Date of Patent: Aug. 17, 2010

(54) FREQUENCY CHARACTERISTIC MEASURING CIRCUIT

(75) Inventor: Shuichi Takada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 12/117,020

(22) Filed: May 8, 2008

(65) Prior Publication Data
US 2008/0278142 A1    Nov. 13, 2008

(30) Foreign Application Priority Data
May 10, 2007  (JP)  ............... 2007-125853

(51) Int. Cl.
*G01R 19/00*    (2006.01)
(52) U.S. Cl. .................. 324/76.11; 374/178; 365/211
(58) Field of Classification Search ............... 324/76.11
See application file for complete search history.

(56) References Cited

U.S. PATENT DOCUMENTS

| | | | |
|---|---|---|---|
| 5,639,163 A * | 6/1997 | Davidson et al. ............ 374/178 |
| 6,786,639 B2 * | 9/2004 | Covi et al. .................. 374/178 |
| 7,075,360 B1 * | 7/2006 | Holloway et al. ............ 327/543 |
| 7,113,761 B2 | 9/2006 | Bickham et al. | |
| 7,120,393 B2 * | 10/2006 | Behzad et al. ................ 455/73 |
| 7,129,689 B2 * | 10/2006 | Lalonde .................... 324/76.11 |
| 7,648,270 B2 * | 1/2010 | Faour et al. ................. 374/178 |
| 2006/0203883 A1 * | 9/2006 | Griffin ........................ 374/178 |
| 2007/0146293 A1 * | 6/2007 | Leo et al. .................... 345/101 |
| 2007/0211548 A1 * | 9/2007 | Jain et al. ................... 365/211 |
| 2007/0284576 A1 * | 12/2007 | Pacha et al. .................. 257/48 |

FOREIGN PATENT DOCUMENTS

JP    11-202032    7/1999

* cited by examiner

*Primary Examiner*—Timothy J Dole
*Assistant Examiner*—Benjamin M Baldridge
(74) *Attorney, Agent, or Firm*—Turocy & Watson, LLP

(57) ABSTRACT

A frequency characteristic measuring circuit is disclosed, which includes a first diode element having differential input nodes and differential output nodes, thermally coupled to a resistance element of a differential amplifying circuit having the resistance element connected between the differential output nodes, and driven by a first constant current source, a second diode element for reference driven by a second constant current source, and a detection circuit which detects a potential difference between forward voltages of the first and second diode elements to output a signal in accordance with the detected potential difference.

17 Claims, 5 Drawing Sheets

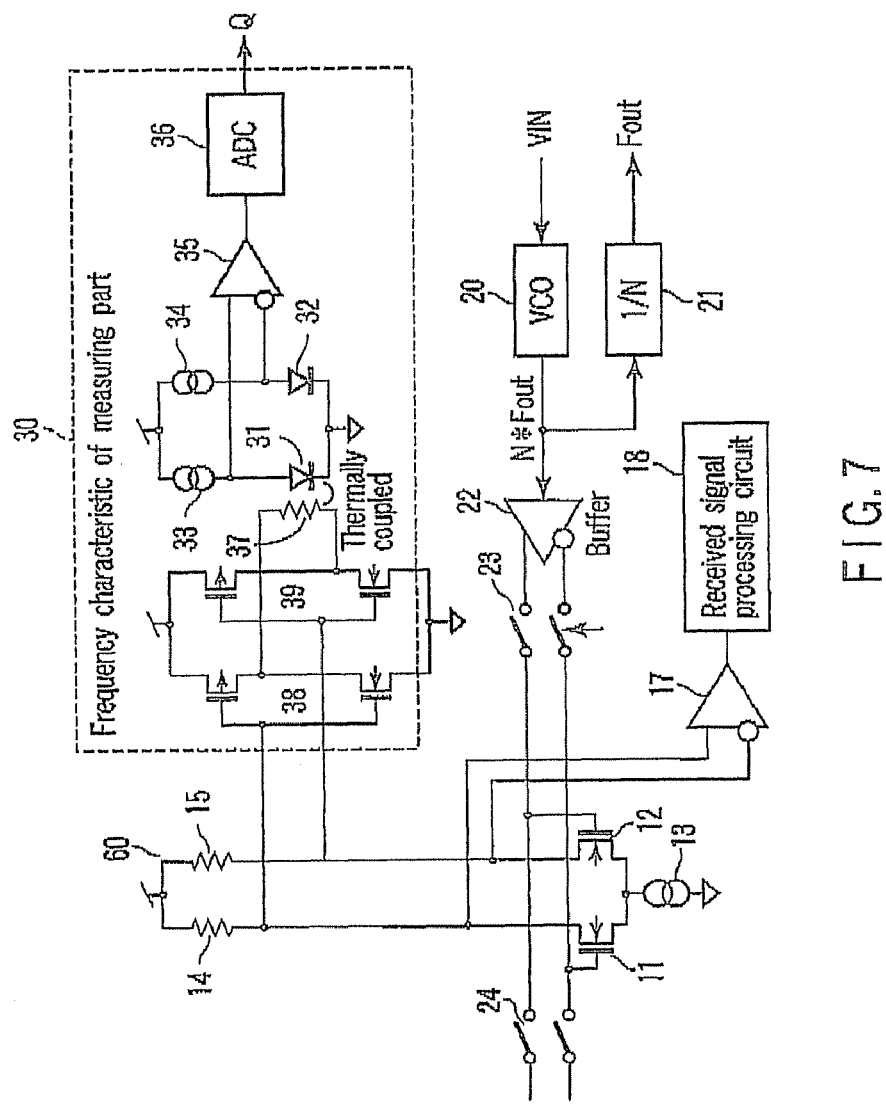
F I G. 7

FREQUENCY CHARACTERISTIC MEASURING CIRCUIT

CROSS-REFERENCE TO RELATED APPLICATIONS

This application is based upon and claims the benefit of priority from prior Japanese Patent Application No. 2007-125853, filed May 10, 2007, the entire contents of which are incorporated herein by reference.

BACKGROUND OF THE INVENTION

1. Field of the Invention

The present invention relates to a frequency characteristic measuring circuit incorporated in a semiconductor integrated circuit for high-speed signal transmission having an input/output (I/O) circuit, and in particular, relates to a frequency characteristic measuring circuit used for excluding shipment of defective semiconductor integrated circuits by detecting defective frequency characteristics of the semiconductor integrated circuits when the semiconductor integrated circuits are in volume production.

2. Description of the Related Art

Conventionally, in order to measure frequency characteristics of a transmitting circuit or a receiving circuit embedded in a semiconductor integrated circuit (hereinafter, referred to as an LSI) for high-speed signal transmission, a signal of a high-frequency signal generator is input into the receiving circuit and output of the receiving circuit is routed out of the LSI using special I/O such as low-voltage differential signaling (LVDS) to thereby measure the output by a measuring apparatus outside the LSI. In this case, frequency characteristics required of the special I/O exceed those of a measuring object.

However, it is very difficult to extract a signal of frequencies in the GHz band or higher from the LSI with reliability due to an influence of package capacitance, printed circuit board (PCB) capacitance, or input capacitance of a measuring apparatus. Even if a signal of frequencies in the GHz band or higher can be extracted from the LSI with reliability, a measurement environment and measuring equipment will be very expensive in that case, requiring new investment in equipment for volume production of LSIs.

Incidentally, Jpn. Pat. Appln. KOKAI Publication No. 11-202032 discloses a method of determining a mounting state of an inspected circuit on a substrate by connecting an oscillator generating a signal of any frequency to an inspection terminal, providing a measuring apparatus for measuring frequency characteristics of an analog signal on the substrate, causing the oscillator to digitally output a signal of any frequency from the inspection terminal to an inspected terminal to measure frequency characteristics of the analog signal by the measuring apparatus, and comparing the measured measurement result with determination values.

BRIEF SUMMARY OF THE INVENTION

According to a first aspect of the present invention, there is provided a frequency characteristic measuring circuit, comprising:

a first diode element having differential input nodes and differential output nodes, thermally coupled to a resistance element of a differential amplifying circuit having the resistance element connected between the differential output nodes, and driven by a first constant current source;

a second diode element for reference driven by a second constant current source; and a detection circuit which detects a potential difference between forward voltages of the first and second diode elements to output a signal in accordance with the detected potential difference.

According to a second aspect of the present invention, there is provided a frequency characteristic measuring circuit, comprising:

a first buffer circuit having an input node to which a signal of one of a pair of differential output nodes of a differential amplifying circuit having a pair of differential input nodes and the pair of differential output nodes is input;

a second buffer circuit having an input node to which a signal of the other of the pair of differential output nodes of the differential amplifying circuit is input;

a resistance element connected between output nodes of the first and second buffer circuits;

a first diode element thermally coupled to the resistance element and driven by a first constant current source;

a second diode element for reference driven by a second constant current source; and a detection circuit which detects a potential difference between forward voltages of the first and second diode elements to output a signal in accordance with the detected potential difference.

According to a third aspect of the present invention, there is provided a semiconductor integrated circuit comprising:

a differential amplifying circuit formed on a semiconductor chip, having a pair of differential input nodes and a pair of differential output nodes, the differential amplifying circuit forming a receiving circuit or a transmitting circuit;

a frequency characteristic measuring circuit formed on the semiconductor chip, comprising a first diode element driven by a first constant current source, a second diode element for reference driven by a second constant current source, and a detection circuit which detects a potential difference between forward voltages of the first and second diode elements to output a signal in accordance with the detected potential difference; and a resistance element connected directly between the pair of differential output nodes of the differential amplifying circuit or indirectly between the pair of differential output nodes of the differential amplifying circuit via first and second buffer circuits, respectively, and thermally coupled to the first diode element of the frequency characteristic measuring circuit.

BRIEF DESCRIPTION OF THE SEVERAL VIEWS OF THE DRAWING

FIG. 7 is a circuit diagram showing a configuration of a structure when the frequency characteristic measuring circuit according to the third embodiment of the present invention is applied to a receiving circuit as shown in FIG. 1.

DETAILED DESCRIPTION OF THE INVENTION

Embodiments of the present invention will be described below with reference to the drawings.

First Embodiment

Figure 1:
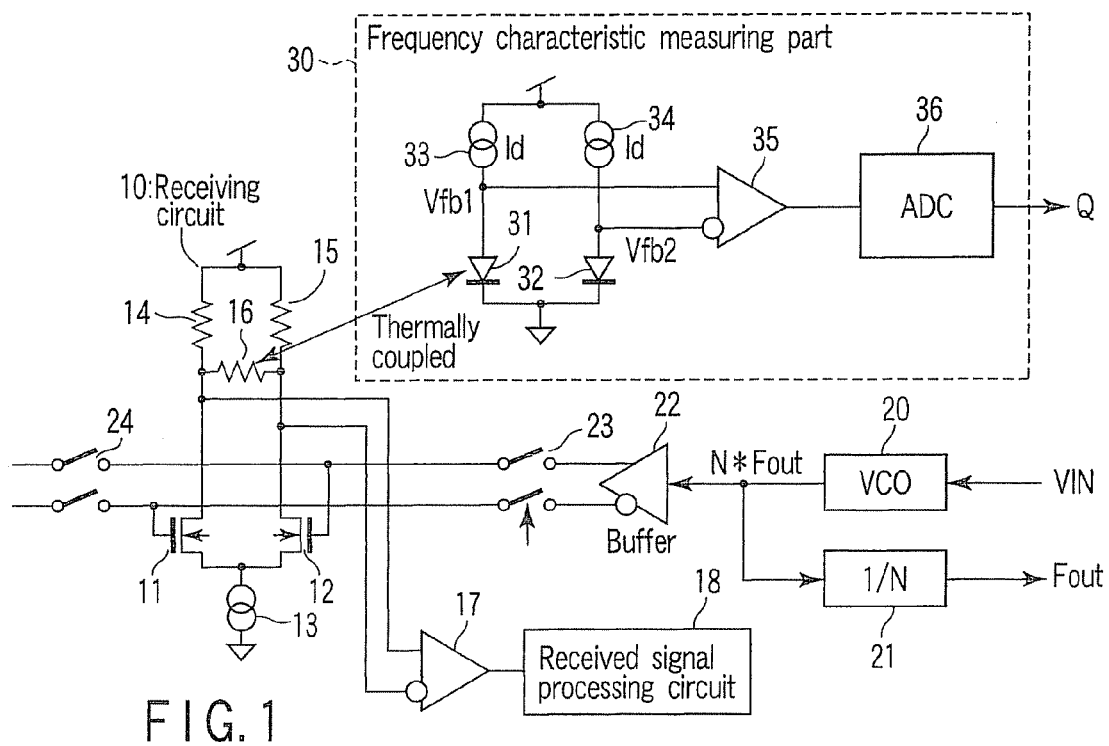
FIG. 1 is a circuit diagram showing a configuration of a frequency characteristic measuring circuit according to a first embodiment of the present invention.

FIG. 1 shows the configuration of a frequency characteristic measuring circuit according to a first embodiment of the present invention, which is an embodiment of the present invention for a receiving circuit in a semiconductor integrated circuit for high-speed signal transmission including a transmitting circuit and the receiving circuit in the GHz band in an I/O (input/output) circuit of the semiconductor integrated circuit. The I/O circuit includes a receiving circuit 10 composed of a differential amplifying circuit that amplifies a differential input signal supplied to a pair of receiving terminals (differential input nodes) to output the amplified signal from a pair of output terminals (differential output nodes). The receiving circuit 10 has a pair of driving N-channel MOS transistors 11, 12 whose gate is connected to each differential input node, a constant current source 13 connected between a source common connection node of the transistors 11, 12 and a ground node, load resistance elements 14, 15 connected between each drain of the transistors 11, 12 and a source voltage supply node respectively, and a resistance element 16 connected between the differential output nodes.

A differential output signal output from the differential output node of the receiving circuit 10 is supplied via a buffer circuit 17 to a received signal processing circuit 18 where various signal processing is performed.

A voltage-controlled oscillator (VCO) 20, a frequency divider 21, a buffer circuit 22, and a pair of switches 23 are also provided in the semiconductor integrated circuit to measure frequency characteristics of the receiving circuit 10. The VCO 20 outputs an oscillation signal N*Fout of a frequency corresponding to a control voltage VIN input from outside the semiconductor integrated circuit. The oscillation signal N*Fout is supplied to the differential input nodes of the receiving circuit 10 via the buffer circuit 22 and the pair of switches 23. The oscillation signal N*Fout of the VCO 20 is also output out of the semiconductor integrated circuit as a signal Fout after being 1/N divided by the frequency divider 21. Further, another pair of switch circuits 24 is connected to the differential input nodes of the receiving circuit 10, i.e., at a side thereof opposite to the side at which the pair of switches 23 is provided. The pair of switch circuits 24 is complementarily controlled to the pair of switch circuits 24.

Further, a frequency characteristic measuring part 30 is provided in the semiconductor integrated circuit to measure frequency characteristics of the receiving circuit 10. The frequency characteristic measuring part 30 includes first and second diode elements 31, 32, first and second constant current sources 33, 34, a differential amplifier 35, and an analog-to-digital converter (ADC) 36. The differential amplifying circuit forming the receiving circuit 10 and the frequency characteristic measuring part 30 are formed in the same semiconductor substrate. In other words, the differential amplifying circuit forming the receiving circuit 10 and the frequency characteristic measuring part 30 are formed on one semiconductor chip. The VCO 20, the frequency divider 21, the buffer circuit 22, the pair of switches 23, the pair of switches 24, the buffer circuit 17 and the received signal processing circuit 18 are also formed in the semiconductor substrate in which the differential amplifying circuit forming the receiving circuit 10 and the frequency characteristic measuring part 30 are formed. In other words, the differential amplifying circuit forming the receiving circuit 10 and the frequency characteristic measuring part 30, and the VCO 20, the frequency divider 21, the buffer circuit 22, the pair of switches 23, the pair of switches 24, the buffer circuit 17 and the received signal processing circuit 18 are all formed in one semiconductor chip.

The first diode element 31 is thermally coupled to the resistance element 16 inside the receiving circuit 10 to enable measurement of frequency characteristics of the receiving circuit 10. The second diode element 32 is intended for reference and arranged with a sufficient distance from the resistance element 16 inside the semiconductor integrated circuit so that the degree of thermal coupling to the resistance element 16 will be sufficiently low to suppress an influence on measurement of frequency characteristics of the receiving circuit 10. The anode and cathode of the first constant current source 33 and the first diode element 31 are serially connected between the source voltage supply node and the ground node. Similarly, the anode and cathode of the second constant current source 34 and the second diode element 32 are serially connected between the source voltage supply node and the ground node. The first and second diode elements 31, 32 are driven by the first and second constant current sources 33, 34 respectively. Forward voltages Vfb1, Vfb2 of the first and second diode elements 31, 32 are supplied to the differential amplifier 35, which detects and amplifies a potential difference between the forward voltages Vfb1, Vfb2. The potential difference detected and amplified by the differential amplifier 35 is supplied to the ADC 36, which converts the potential difference into a digital signal Q and outputs the digital signal Q out of the semiconductor integrated circuit.

Figure 2:
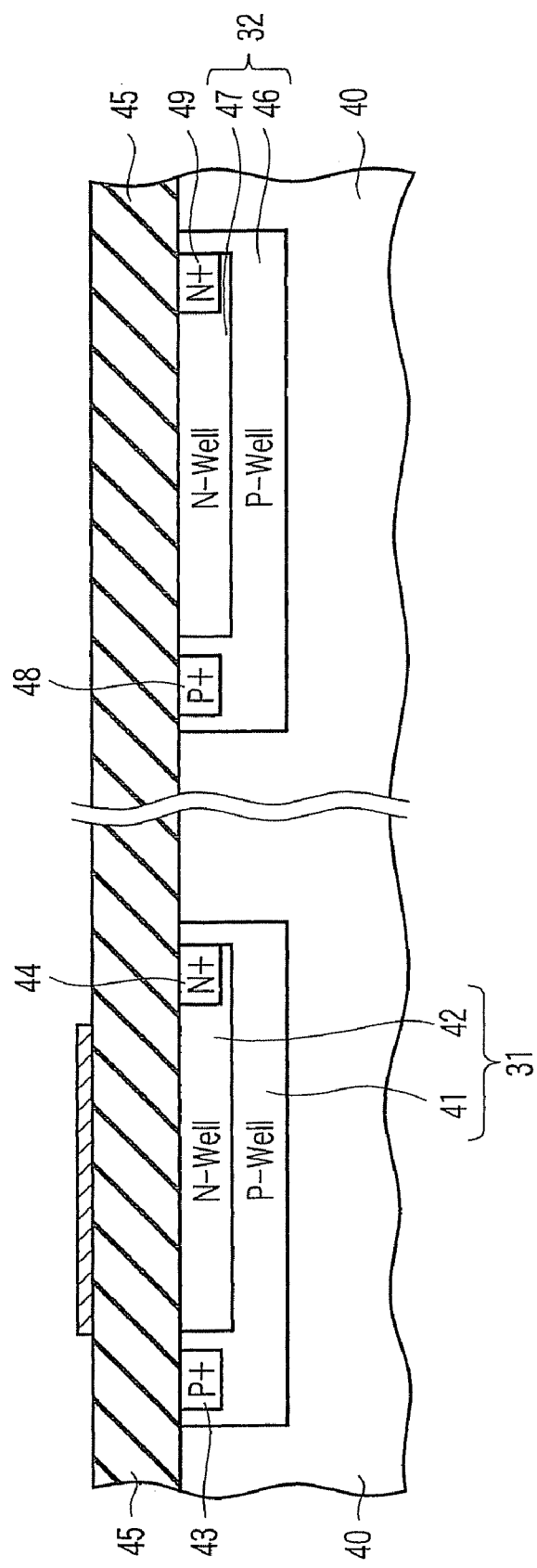
FIG. 2 is a sectional view exemplifying a structure of a resistance element of a receiving circuit and a first diode element and a second diode element of a frequency characteristic measuring part in the circuit shown in FIG. 1.

FIG. 2 is a sectional view exemplifying an element structure of the resistance element 16 in the receiving circuit 10 and the first diode element 31 and second diode element 32 in the frequency characteristic measuring part 30. A P-well 41 is formed in an N silicon semiconductor substrate 40. An N-well 42 is formed in the P-well 41. A pn junction between the P-well 41 and the N-well 42 forms the first diode element 31. A P+ diffusion area 43 constituting a P side contact area of the first diode element 31 is formed in the P-well 41. An N+ diffusion area 44 constituting an N side contact area of the first diode element 31 is formed in the N-well 42. The resistance element 16 is made of, for example, polysilicon, and formed above the N-well 42 via a dielectric film 45. In short, the pn junction forming the first diode element 31 (i.e., pn junction between the P-well 41 and the N-well 42) is formed, i.e., embedded, in a portion of the N silicon semiconductor substrate 40, which is under the resistance element 16. With the structure, the first diode element 31 is formed close to the resistance element 16 of the receiving circuit 10 so that the first diode element 31 is thermally coupled to the resistance element 16.

Also, a P-well 46 is formed in a portion of the N silicon semiconductor substrate 40, which is away from the resistance element 16. An N-well 47 is formed in the P-well 46. A pn junction between the P-well 46 and the N-well 47 forms the second diode element 32. A P+ diffusion area 48 constituting a P side contact area of the second diode element 32 is formed in the P-well 46. An N+ diffusion area 49 constituting an N side contact area of the second diode element 32 is formed in the N-well 47. That is, the pn junction forming the second diode element 32 (i.e., pn junction between the P-well 46 and the N-well 47) is formed, i.e., embedded, in a portion of the N silicon semiconductor substrate 40, which is away from the resistance element 16 of the receiving circuit 10. With the structure, the second diode element 32 is formed away from the resistance element 16 of the receiving circuit 10 so that the second diode element 32 is thermally non-coupled to the resistance element 16.

As described above, the first diode element 31 is formed close to the resistance element 16 of the receiving circuit 10 so that the first diode element 31 is thermally coupled to the resistance element 16. Thus, when the resistance element 16 generates heat, a change in temperature due to the generated heat is immediately conducted to the first diode element 31. On the other hand, the second diode element 32 is formed away from the resistance element 16 of the receiving circuit 10 so that the second diode element 32 is thermally non-coupled to the resistance element 16. Thus, even when the resistance element 16 generates heat, the change in temperature due to the generated heat is hardly conducted to the first diode element 31. The VCO 20 in the GHz band is used to measure frequency characteristics in the GHz band of the receiving circuit 10, but a VCO in the GHz band is already provided as an attached circuit in a semiconductor integrated circuit having a transmitting circuit and a receiving circuit in the GHz band, and the VCO embedded as an attached circuit can be used as the VCO 20. By using the VCO embedded as an attached circuit as the VCO 20, there is no need to add a new VCO as the VCO 20. Therefore, circuits that need to be newly added include the frequency divider 21, the buffer circuit 22, the pair of switches 23, the frequency characteristic measuring part 30, and the pair of switches 24.

When frequency characteristics of the receiving circuit 10 are measured in a circuit configured as described above, the control voltage VIN is input from outside the semiconductor integrated circuit without a signal generated inside the semiconductor integrated circuit being input into the differential input nodes of the receiving circuit 10. At this point, the pair of switches 24 is turned off so that a signal generated inside the semiconductor integrated circuit is blocked from being input into the differential input nodes of the receiving circuit 10. Also, at this point, the pair of switches 23 is turned on so that the oscillation signal N*Fout output from the VCO 20 is supplied to the receiving circuit 10 via the buffer circuit 22 and the pair of switches 23. The frequency of a signal supplied to the receiving circuit 10 is observed outside the semiconductor integrated circuit as a frequency divided signal via the frequency divider 21.

In the frequency characteristic measuring part 30, constant currents are caused to flow from the first and second constant current sources 33, 34 to the first and second diode elements 31, 32, respectively, and the potential difference (Vfb1-Vfb2) of the forward voltages Vfb1, Vfb2 of the first and second diode elements 31, 32 is detected and amplified by the differential amplifier 35 and the amplified potential difference is converted into the digital value Q by the ADC 36 for output.

Figure 3:
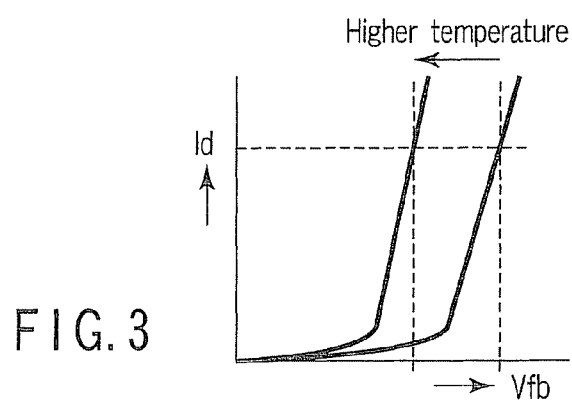
FIG. 3 is a diagram showing temperature characteristics of a current Id flowing in the diode element and a forward voltage Vfb.

If values of currents flowing in the first and second diode elements 31, 32 and temperatures of the first and second diode elements 31, 32 are equal to each other, the forward voltages Vfb1, Vfb2 will be equal. The first diode element 31 is thermally coupled to the resistance element 16 inside the receiving circuit 10 while the degree of thermal coupling between the second diode element 32 and the resistance element 16 is set to be sufficiently low. Therefore, when a current flows in the resistance element 16 to generate heat after the receiving circuit 10 operates based on a signal from the VCO 20, the temperature of the thermally coupled first diode element 31 rises and a potential difference between forward voltages between the first diode element 31 and the second diode element 32 arises. Since the relationship of the potential difference with respect to the temperature is as shown in FIG. 3, a temperature difference can be estimated from the potential difference. That is, FIG. 3 shows temperature characteristics of the current Id flowing in a diode element and the forward voltage Vfb. According to FIG. 3, the forward voltage Vfb and the temperature when the same current Id is passed are inversely proportional.

Power Prms consumed by passing a current to a resistance element is given by the following formula, regardless of the waveform of the flowing current.

$$P_{rms} = \sqrt{\frac{1}{T}\int P^2(t)dt} \quad (1)$$

The power consumption Prms given by the above formula (1) is an effective value. Since the effective power consumed by a resistance element is converted to heat regardless of the waveform of a flowing current, a quantity of heat generated in the resistance element 16 will be constant if frequency characteristics of the receiving circuit 10 are constant.

Further, since an alternating current (AC) is once converted to a quantity of heat, its time constant will be very long and the potential difference of forward voltages of the first and second diode elements 31, 32 is converted to a direct current (DC) extending from low frequencies to high.

Figure 4:
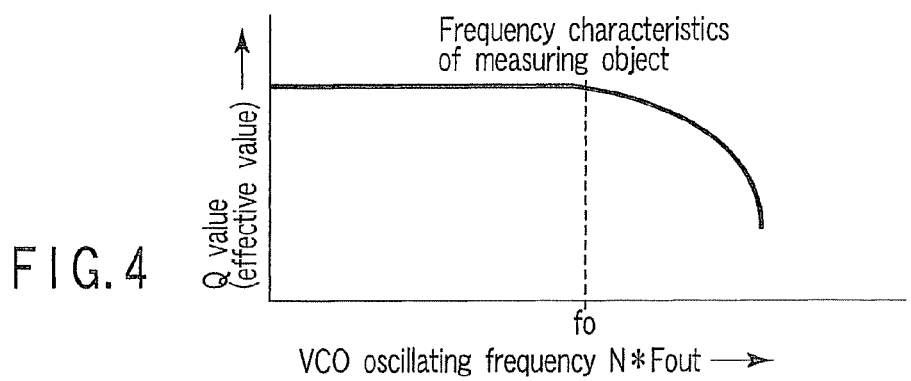
FIG. 4 is a characteristic diagram showing a relationship between an oscillating frequency NxFout of a voltage-controlled oscillator VCO and a measurement result Q of a quantity of heat.

Frequency characteristics shown in FIG. 4 are obtained by causing the frequency to change from low frequencies to high by adjusting the control voltage VIN and acquiring frequency divided output Fout obtained by the frequency divider 21 and a measurement result Q of the quantity of heat in the resistance element 16 at this time obtained by the ADC 36. In FIG. 4, an oscillating frequency N*Fout of the VCO 20 is taken as the horizontal axis and the measurement result (a quantity of heat) Q (effective value) is taken as the vertical axis. Frequency characteristics in FIG. 4 show that the current flowing in the resistance element 16 begins to decrease and thus, amplification characteristics of the receiving circuit 10 begin to deteriorate when the operating frequency is around f0. This indicates that the receiving circuit 10 performs an amplification operation normally before the operating frequency reaches f0 or so.

According to the present embodiment, as described above, frequency characteristics of the receiving circuit 10 can be obtained by observing the frequency divided output Fout obtained by the frequency divider 21 and the measurement result Q obtained by the ADC 36 when the control value VIN is caused to change. Accordingly, defective frequency characteristics in volume production process of LSIs can be detected to exclude shipment of defective LSIs.

Moreover, in the present embodiment, there is no need to use special I/O such as LVDS. In addition, signals in the GHz band or higher need not be extracted from an LSI as before and thus, the above observation is hardly affected by package capacitance, PCB capacitance, or input capacitance of a measuring apparatus. Therefore, performance of only the inspection object, the receiving circuit 10, can be measured. Further, there is no need to use an expensive measuring apparatus, eliminating the need for new investment in equipment for volume production of LSIs.

Second Embodiment

Figure 5:
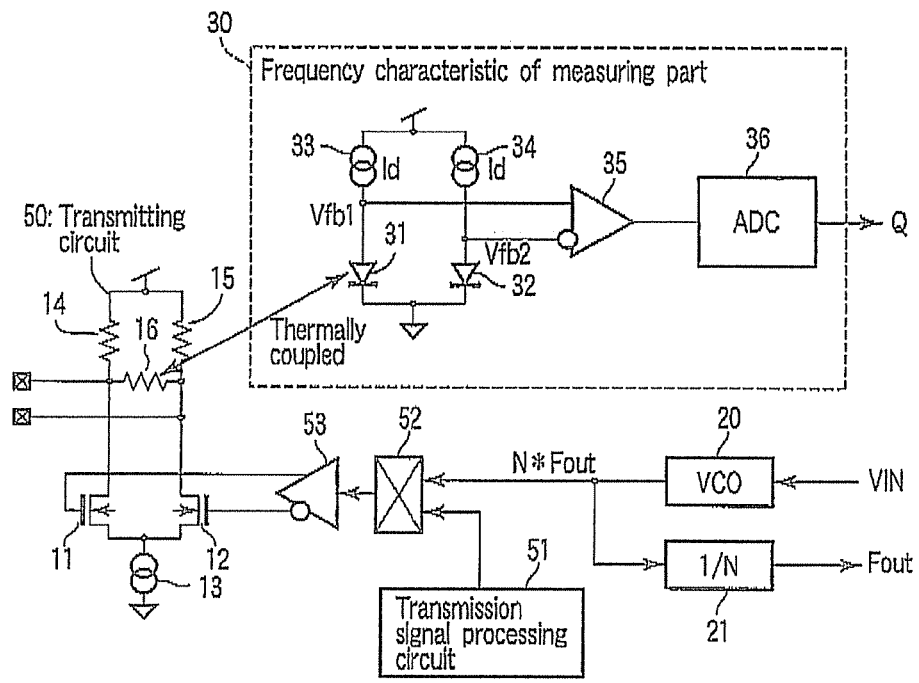
FIG. 5 is a circuit diagram showing a configuration of a frequency characteristic measuring circuit according to a second embodiment of the present invention.

FIG. 5 shows the configuration of a frequency characteristic measuring circuit according to a second embodiment of the present invention, which is an embodiment of the present invention for a transmitting circuit in a semiconductor integrated circuit for high-speed signal transmission including the transmitting circuit and a receiving circuit in the GHz band in an I/O circuit of the semiconductor integrated circuit. The I/O circuit includes a transmitting circuit 50 composed of a differential amplifying circuit that amplifies a differential input signal supplied to a pair of receiving terminals (differential input nodes) thereof to output the amplified signal from a pair of output terminals (differential output nodes) thereof. The transmitting circuit 50 has, like the receiving circuit 10 in the first embodiment, a pair of driving N-channel MOS transistors 11, 12, a constant current source 13, load resistance elements 14, 15, and a resistance element 16.

A transmission signal processing circuit 51 outputs a signal to be transmitted from the transmitting circuit 50. An output signal of the transmitting circuit 50 is supplied to the differential input node of the transmitting circuit 50 via a selection circuit 52 and a buffer circuit 53.

The voltage-controlled oscillator (VCO) 20 and the frequency divider 21 are provided in the semiconductor integrated circuit, like in the first embodiment, to measure frequency characteristics of the transmitting circuit 50. The VCO 20 outputs an oscillation signal N*Fout of a frequency corresponding to the control voltage VIN input from outside the semiconductor integrated circuit. The oscillation signal N*Fout is supplied to the differential input node of the transmitting circuit 50 via the selection circuit 52 and the buffer circuit 53. The oscillation signal N*Fout of the VCO 20 is also output out of the semiconductor integrated circuit as a frequency divided low-frequency signal Fout after being 1/N divided by the frequency divider 21.

Further, the frequency characteristic measuring part 30 with the same configuration as that in the first embodiment is provided in the semiconductor integrated circuit to measure frequency characteristics of the transmitting circuit 50. The frequency characteristic measuring part 30 includes the first and second diode elements 31, 32, the first and second constant current sources 33, 34, the differential amplifier 35, and the analog-to-digital converter (ADC) 36. The first diode element 31 is thermally coupled, in substantially the same manner as in the first embodiment, to the resistance element 16 inside the transmitting circuit 50 to enable measurement of frequency characteristics of the transmitting circuit 50. The second diode element 32 is intended for reference and arranged with a sufficient distance from the resistance element 16 inside the semiconductor integrated circuit so that the degree of thermal coupling to the resistance element 16 will be sufficiently low to suppress an influence on measurement of frequency characteristics of the transmitting circuit 50.

When frequency characteristics of the transmitting circuit 50 are measured in a circuit configured as described above, the control voltage VIN is input from outside the semiconductor integrated circuit. At this point, the selection circuit 52 is controlled to select the oscillation signal N*Fout output from the VCO 20 so that the oscillation signal N*Fout output from the VCO 20 is supplied to the transmitting circuit 50 via the selection circuit 52 and the buffer circuit 53. The frequency of the signal supplied to the transmitting circuit 50 is observed outside the semiconductor integrated circuit as a frequency divided signal via the frequency divider 21.

Also in the present embodiment, like in the first embodiment, frequency characteristics of the transmitting circuit 50 can be obtained by observing the frequency divided output Fout obtained by the frequency divider 21 and the measurement result Q obtained by the ADC 36 when the control value VIN is caused to change. Then, also in the present embodiment, an effect similar to that in the first embodiment can be achieved. In the description of the present embodiment, the same description as that in the first embodiment or a similar one is omitted according to circumstances to simplify the description.

Third Embodiment

The first and second embodiments have been described by assuming that a transmitting circuit or a receiving circuit composed of a differential amplifying circuit has a structure in which the resistance element 16 is connected between differential output nodes and the first diode element 31 inside the frequency characteristic measuring part 30 is thermally coupled to the resistance element 16.

Figure 6:
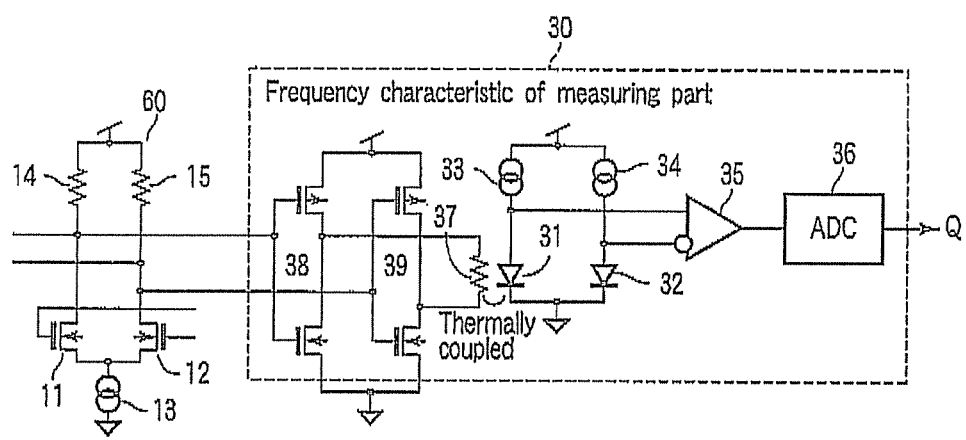
FIG. 6 is a circuit diagram showing a configuration of a frequency characteristic measuring circuit according to a third embodiment of the present invention.

However, if the differential amplifying circuit does not have the resistance element 16 and is composed of, as shown in FIG. 6, only the pair of driving N-channel MOS transistors 11, 12, the constant current source 13, and the load resistance elements 14, 15, means whose temperature changes in accordance with the operating frequency of the differential amplifying circuit may be provided inside the frequency characteristic measuring part 30.

FIG. 6 shows a configuration of a frequency characteristic measuring circuit according to a third embodiment of the present invention, which is an embodiment of the present invention for a transmitting circuit or a receiving circuit in a semiconductor integrated circuit for high-speed signal transmission including the transmitting circuit and the receiving circuit in the GHz band in an I/O circuit the semiconductor integrated circuit. A differential amplifying circuit 60 corresponds to the receiving circuit 10 in FIG. 1 or the transmitting circuit 50 in FIG. 5. However, the differential amplifying circuit 60 does not have the resistance element 16 between the differential output nodes thereof and is composed of only the pair of driving N-channel MOS transistors 11, 12, the constant current source 13, and the load resistance elements 14, 15.

Thus, a resistance element 37 as means whose temperature changes in accordance with the operation frequency of the differential amplifying circuit 60 is added to the frequency characteristic measuring part 30 in the present embodiment. Further, the frequency characteristic measuring part 30 has first and second buffer circuits 38, 39 each composed of a P-channel MOS transistor and an N-channel MOS transistor, respectively. Input nodes of the first and second buffer circuits 38, 39 are connected to one differential output node and the other differential output node, respectively, of the differential amplifying circuit 60 so that a signal of one differential output node and a signal of the other differential output node of the differential amplifying circuit 60 are input to the first and second buffer circuits 38, 39, respectively. The resistance element 37 is connected between output nodes of the first and second buffer circuits 38, 39. Then, the first diode element 31 is thermally coupled to the resistance element 37 to make it possible to measure the frequency characteristics of the differential amplifying circuit 60. The second diode element 32 is for reference and arranged with a sufficient distance from the resistance element 37 inside the semiconductor integrated circuit so that the degree of thermal coupling of the second diode element 32 to the resistance element 37 will be sufficiently low to suppress an influence on measurement of frequency characteristics of the differential amplifying circuit 60.

Figure 8:
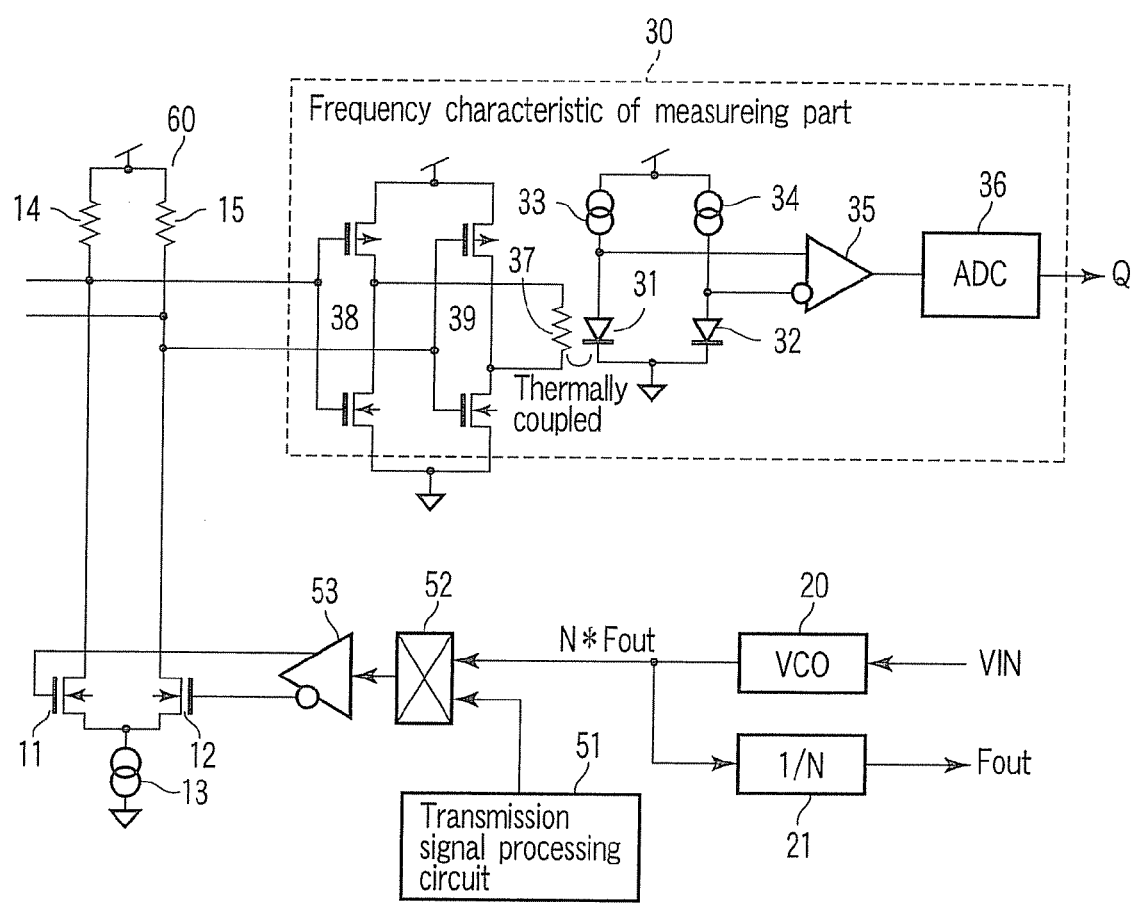
FIG. 8 is a circuit diagram showing a configuration of a structure when the frequency characteristic measuring circuit according to the third embodiment of the present invention is applied to a transmitting circuit as shown in FIG. 5.

FIG. 6 does not illustrate other components than the differential amplifying circuit 60 and the frequency characteristic measuring part 30, however if, for example, the differential amplifying circuit 60 corresponds to the receiving circuit 10 in FIG. 1, like in FIG. 1, the VCO 20, the frequency divider 21, the buffer circuit 22 and the pair of switches 23, and the pair of switches 24 are provided, as shown in FIG. 7. If the differential amplifying circuit 60 corresponds to the transmitting circuit 50 in FIG. 1, like in FIG. 5, the VCO 20, the frequency divider 21, the selecting circuits 52 and the buffer circuit 53 are provided, as shown in FIG. 8.

The a quantity of heat generated in the resistance element 37 provided inside the frequency characteristic measuring part 30 configured as described above will be one corresponding to frequency characteristics of the differential amplifying circuit 60. Thus, frequency characteristics of the differential amplifying circuit 60 can be obtained by observing the frequency divided output Fout obtained by the frequency divider 21 and the measurement result Q obtained by the ADC 36 when the control value VIN is caused to change for measurement of frequency characteristics of the differential amplifying circuit 60.

In the present embodiment, an effect similar to that in the first and second embodiments can also be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency characteristic measuring circuit, wherein the frequency characteristic is based on a relationship between an oscillating frequency of a voltage controlled oscillator and a measurement result of a quantity of heat from the voltage controlled oscillator, the circuit comprising:
   a first diode element driven by a first constant current source, wherein the first diode element is thermally coupled to a first resistance element of a differential amplifying circuit, and wherein the resistance element of the differential amplifying circuit is connected between differential output nodes of the differential amplifying circuit, and wherein the differential amplifying circuit is a receiving circuit or a transmitting circuit provided in an I/O circuit of a semiconductor integrated circuit for high-speed signal transmission;
   a second diode element used as a reference, driven by a second constant current source; and
   a detection circuit which detects a potential difference between forward voltages of the first and second diode elements, and outputs a signal that is a function of the detected potential difference, the output signal being an indication of the quantity of heat produced by the voltage controlled oscillator during operation.

2. The frequency characteristic measuring circuit according to claim 1, wherein the detection circuit comprises a differential amplifier which detects the potential difference between the forward voltages of the first diode and the second diode and an analog-to-digital converter which converts the potential difference detected and amplified by the differential amplifier to a digital signal.

3. The frequency characteristic measuring circuit according to claim 1, wherein the first resistance element is formed in a portion of a semiconductor substrate above which a second resistance element of the differential amplifying circuit is provided.

4. The frequency characteristic measuring circuit according to claim 3, wherein the second resistance element is not directly thermally coupled with the first resistance element of the differential amplifying circuit.

5. The frequency characteristic measuring circuit according to claim 3, wherein the second resistance element is formed in a portion of a semiconductor substrate that is not physically contiguous to a portion of the semiconductor substrate above which the first resistance element of the differential amplifying circuit is provided.

6. The frequency characteristic measuring circuit according to claim 1, further comprising a converter which converts a voltage signal representing a frequency characteristic measurement that is inputted to the differential input nodes of the differential amplifying circuit to a frequency signal, and a frequency dividing circuit which divides a frequency of an output frequency signal of the converter to provide a frequency divided output signal.

7. A frequency characteristic measuring circuit, wherein the frequency characteristic is based on a relationship between an oscillating frequency of a voltage controlled oscillator and a measurement result of a quantity of heat from the voltage controlled oscillator, the circuit comprising:
   a first buffer circuit having an input node that receives a signal from one of a pair of differential output nodes of a differential amplifying circuit having a pair of differential input nodes and the pair of differential output nodes, wherein the differential amplifying circuit is a receiving circuit or a transmitting circuit provided in an I/O circuit of a semiconductor integrated circuit for high-speed signal transmission;
   a second buffer circuit having an input node that receives a signal from the other of the pair of differential output nodes of the differential amplifying circuit;
   a first resistance element connected between output nodes of the first and second buffer circuits;
   a first diode element thermally coupled to the first resistance element and driven by a first constant current source;
   a second diode element used as a reference driven by a second constant current source; and
   a detection circuit which detects a potential difference between forward voltages of the first and second diode elements and outputs a signal that is a function of the detected potential difference, the output signal being an indication of the quantity of heat produced by the voltage controlled oscillator during operation.

8. The frequency characteristic measuring circuit according to claim 7, wherein the detection circuit comprises a differential amplifier which detects the potential difference between the forward voltages of the first and second diode and an analog-to-digital converter which converts the potential difference detected and amplified by the differential amplifier to a digital signal.

9. The frequency characteristic measuring circuit according to claim 7, the first resistance element is formed in a portion of a semiconductor substrate above which a second resistance element of the differential amplifying circuit is provided.

10. The frequency characteristic measuring circuit according to claim 9, wherein the second resistance element is not directly thermally coupled with the first resistance element of the differential amplifying circuit.

11. The frequency characteristic measuring circuit according to claim 9, wherein the second resistance element is formed in a portion of a semiconductor substrate that is not physically contiguous to a portion of the semiconductor substrate above which the first resistance element of the differential amplifying circuit is provided.

12. The frequency characteristic measuring circuit according to claim 7, further comprising a converter which converts a voltage signal representing a frequency characteristic measurement that is inputted to the differential input nodes of the differential amplifying circuit to a frequency signal, and a frequency dividing circuit which divides a frequency of an output frequency signal of the converter to provide a frequency divided output signal.

13. A semiconductor integrated circuit, comprising:
a differential amplifying circuit formed on a semiconductor chip, having a pair of differential input nodes and a pair of differential output nodes, the differential amplifying circuit forming a receiving circuit or a transmitting circuit provided in an I/O circuit of a semiconductor integrated circuit for high-speed signal transmission;
a frequency characteristic measuring circuit formed on the semiconductor chip, wherein the frequency characteristic is based on a relationship between an oscillating frequency of a voltage controlled oscillator and a measurement result of a quantity of heat from the voltage controlled oscillator, comprising a first diode element driven by a first constant current source,
a second diode element used as a reference driven by a second constant current source, and
a detection circuit which detects a potential difference between forward voltages of the first and second diode elements to output a signal that is a function of the detected potential difference, wherein the output signal is an indication of the quantity of heat produced by the voltage controlled oscillator during operation, and
a first resistance element connected directly between the pair of differential output nodes of the differential amplifying circuit or indirectly between the pair of differential output nodes of the differential amplifying circuit via first and second buffer circuits, respectively, and thermally coupled to the first diode element of the frequency characteristic measuring circuit.

14. The semiconductor integrated circuit according to claim 13, wherein the first resistance element is formed in a portion of a semiconductor substrate above which a second resistance element of the differential amplifying circuit is provided.

15. The semiconductor integrated circuit according to claim 14, wherein the second resistance element is not directly thermally coupled with the first resistance element of the differential amplifying circuit.

16. The semiconductor integrated circuit according to claim 14, wherein the second resistance element is formed in a portion of a semiconductor substrate that is not physically contiguous to a portion of the semiconductor substrate above which the first resistance element of the differential amplifying circuit is provided.

17. The semiconductor integrated circuit according to claim 13, further comprising a converter which converts a voltage signal representing a frequency characteristic measurement that is inputted to the differential input nodes of the differential amplifying circuit to a frequency signal, and a frequency dividing circuit which divides a frequency of an output frequency signal of the converter to provide a frequency divided output signal.

* * * * *